United States Patent
LaVine

(10) Patent No.: US 10,061,671 B2
(45) Date of Patent: Aug. 28, 2018

(54) APPARATUS AND METHODS FOR LOGIC ANALYSIS TO DETECT TRIGGER CONDITIONS RELATING TO DATA HANDLING TRANSACTIONS IN SYSTEMS USING TRANSACTION IDENTIFIERS

(71) Applicant: ARM Limited, Cambridge (GB)

(72) Inventor: Mark Gerald LaVine, Austin, TX (US)

(73) Assignee: ARM Limited, Cambridge (GB)

( * ) Notice: Subject to any disclaimer, the term of this patent is extended or adjusted under 35 U.S.C. 154(b) by 73 days.

(21) Appl. No.: 14/684,558

(22) Filed: Apr. 13, 2015

(65) Prior Publication Data

US 2016/0299825 A1    Oct. 13, 2016

(51) Int. Cl.
*G06F 11/27* (2006.01)
*G06F 11/25* (2006.01)
(Continued)

(52) U.S. Cl.
CPC ............ *G06F 11/25* (2013.01); *G06F 11/273* (2013.01); *G06F 11/3471* (2013.01);
(Continued)

(58) Field of Classification Search
CPC ............ G06F 11/3089; G06F 11/3093; G06F 11/362; G06F 11/3604; G06F 11/3608;
(Continued)

(56) References Cited

U.S. PATENT DOCUMENTS

| | | |
|---|---|---|
| 6,633,838 B1 | 10/2003 | Arimilli et al. |
| 7,080,283 B1 | 7/2006 | Songer et al. |

(Continued)

FOREIGN PATENT DOCUMENTS

WO    01/61493    8/2001

OTHER PUBLICATIONS

UK Combined Search and Examination Report dated Sep. 16, 2016 in GB 1605832.3, 8 pages.
UK Examination Report dated Nov. 6, 2017 in GB 1605832.3, 2 pages.

*Primary Examiner* — Joseph O Schell
(74) *Attorney, Agent, or Firm* — Nixon & Vanderhye P.C.

(57) ABSTRACT

Apparatus comprising logic analyzer circuitry comprises a succession of two or more successive trigger condition detectors each configured to detect a match between a respective trigger condition and data handling activity relating to data handling transactions each having a respective transaction identifier; the succession of trigger condition detectors being configured so that a detection by a trigger condition detector of a match with its respective trigger condition enables a next trigger condition detector in the succession to initiate detection of a match with the respective trigger condition of that next trigger condition detector; and a transaction identifier detector associated with a first trigger condition detector in the succession, configured to detect the transaction identifier relating to a data handling transaction for which a match is detected by the first trigger condition detector, and to supply the detected transaction identifier to a subsequent trigger condition detector in the succession of trigger condition detectors; in which the subsequent trigger condition detector is configured to apply the detected transaction identifier as at least a part of its respective trigger condition so as to detect a match only in respect of a data handling transaction having that transaction identifier.

14 Claims, 4 Drawing Sheets

(51) Int. Cl.
*G06F 11/273* (2006.01)
*G06F 11/34* (2006.01)
*G01R 31/3177* (2006.01)
*G06F 11/30* (2006.01)

(52) U.S. Cl.
CPC .......... *G01R 31/3177* (2013.01); *G06F 11/27* (2013.01); *G06F 11/3089* (2013.01); *G06F 2201/87* (2013.01)

(58) Field of Classification Search
CPC .... G06F 11/3648; G06F 11/364; G06F 11/25; G06F 11/26; G06F 11/273; G06F 2201/87; G01R 31/3177; G01R 31/317
See application file for complete search history.

(56) References Cited

U.S. PATENT DOCUMENTS

| | | | |
|---|---|---|---|
| 2003/0023901 A1* | 1/2003 | Hack | G06F 11/364 714/25 |
| 2003/0097615 A1* | 5/2003 | Corti | G06F 11/3636 714/37 |
| 2004/0019828 A1 | 1/2004 | Gergen et al. | |
| 2004/0243894 A1 | 12/2004 | Smith et al. | |
| 2011/0167311 A1* | 7/2011 | Bailey | G06F 11/2294 714/733 |
| 2011/0321015 A1* | 12/2011 | Chew | G06F 11/364 717/127 |
| 2014/0032801 A1 | 1/2014 | Nixon et al. | |

* cited by examiner

APPARATUS AND METHODS FOR LOGIC ANALYSIS TO DETECT TRIGGER CONDITIONS RELATING TO DATA HANDLING TRANSACTIONS IN SYSTEMS USING TRANSACTION IDENTIFIERS

BACKGROUND

This disclosure relates to logic analysis.

There are a number of occasions where it is desirable to keep track of the processing activities being performed by data processing apparatus.

It is known to provide logic analysers which switch between a plurality of trigger states, each trigger state corresponding to a state in which one or more hardware signals of the hardware circuitry under test are matched against predetermined values to identify predetermined conditions/states of the hardware circuitry. Such logic analysers can be useful in the context of debugging hardware functionality.

Logic analysers may be applicable to, for example, analysing data handling activity relating to transactions between data handling nodes connected to interconnect circuitry. In this type of environment, individual transactions such as memory accesses may take a period of time between initiation and completion. The transactions may be identified by transaction identifiers while they are in progress.

SUMMARY

In an example arrangement there is provided apparatus comprising logic analyser circuitry, the logic analyser circuitry comprising:

a succession of two or more successive trigger condition detectors each configured to detect a match between a respective trigger condition and data handling activity relating to data handling transactions each having a respective transaction identifier;

the succession of trigger condition detectors being configured so that a detection by a trigger condition detector of a match with its respective trigger condition enables a next trigger condition detector in the succession to initiate detection of a match with the respective trigger condition of that next trigger condition detector; and a transaction identifier detector associated with a first trigger condition detector in the succession, configured to detect the transaction identifier relating to a data handling transaction for which a match is detected by the first trigger condition detector, and to supply the detected transaction identifier to a subsequent trigger condition detector in the succession of trigger condition detectors;

in which the subsequent trigger condition detector is configured to apply the detected transaction identifier as at least a part of its respective trigger condition so as to detect a match only in respect of a data handling transaction having that transaction identifier.

In another example arrangement there is provided a data processing apparatus comprising:

apparatus as defined above;

a plurality of data handling nodes; and interconnect circuitry connected to the plurality of data handling nodes;

in which the apparatus comprising logic analyser circuitry is configured to detect matches with trigger conditions in respect of data handling activity relating to data handling transactions between the data handling nodes via the interconnect circuitry.

In another example arrangement there is provided apparatus comprising logic analyser circuitry, the logic analyser circuitry comprising:

a succession of two or more successive trigger condition detection means for detecting a match between a respective trigger condition and data handling activity relating to data handling transactions each having a respective transaction identifier;

the succession of trigger condition detection means being operable so that a detection by a trigger condition detection means of a match with its respective trigger condition enables a next trigger condition detection means in the succession to initiate detection of a match with the respective trigger condition of that next trigger condition detection means; and a transaction identifier detection means associated with a first trigger condition detection means in the succession, configured to detect the transaction identifier relating to a data handling transaction for which a match is detected by the first trigger condition detection means, and to supply the detected transaction identifier to a subsequent trigger condition detection means in the succession of trigger condition detection means;

in which the subsequent trigger condition detection means is configured to apply the detected transaction identifier as at least a part of its respective trigger condition so as to detect a match only in respect of a data handling transaction having that transaction identifier.

In another example arrangement there is provided a method of logic analysis, the method comprising:

detecting a match between a trigger condition and data handling activity relating to data handling transactions each having a respective transaction identifier;

detecting the transaction identifier relating to a data handling transaction for which a match is detected;

supplying the detected transaction identifier to a subsequent trigger condition detection stage in a succession of trigger condition detections, the subsequent trigger condition detection stage applying the detected transaction identifier as at least a part of a respective trigger condition so as to detect a match only in respect of a data handling transaction having that transaction identifier; and in response to detection of a match, enabling a next stage in the succession of trigger condition detections, to detect a match with a next trigger condition.

In another example arrangement there is provided a diagnostic apparatus comprising an input configured to receive a stream of trace data from apparatus comprising logic analyser circuitry as defined above and which comprises a trace data generator configured to generate trace data indicative of a data handling transaction for which at least one of the trigger condition detectors detected a match, and a data processing element configured to process the trace data.

In another example arrangement there is provided a diagnostic method comprising:

receiving a stream of trace data generated by the method defined above, with the step of generating trace data indicative of a data handling transaction for which at least one of the trigger condition detectors detected a match; and processing the trace data.

In another example arrangement there is provided a non-transitory machine-readable medium carrying computer software which, when executed by a computer, causes the computer to perform the diagnostic method defined above.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
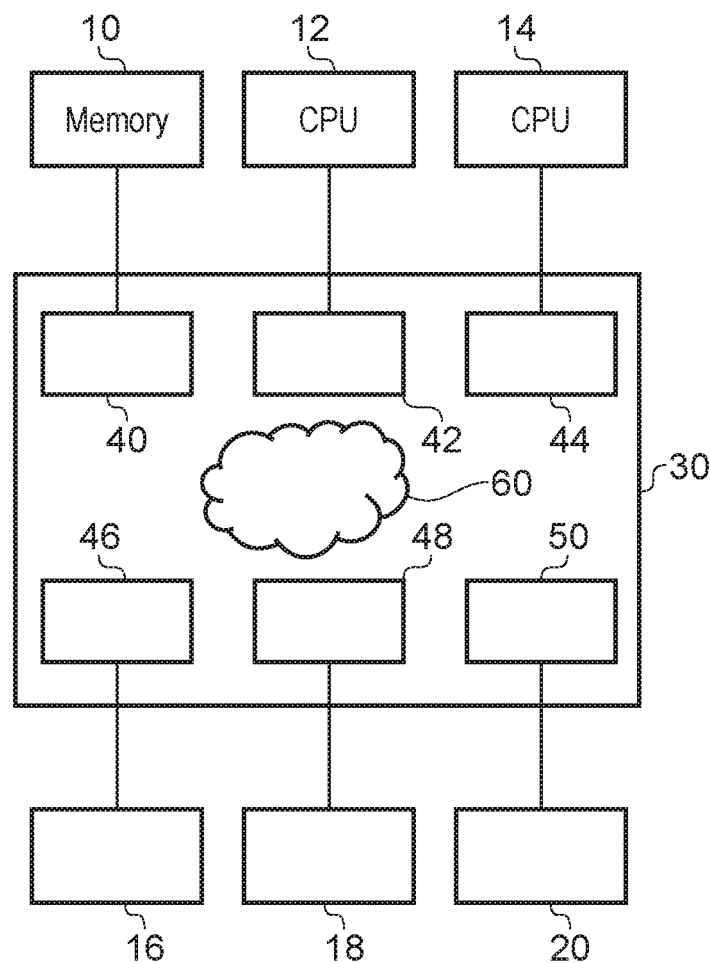
FIG. 1 schematically illustrates a data processing apparatus.

Before discussing the embodiments with reference to the accompanying figures, the following description of embodiments is provided.

An example embodiment provides apparatus comprising logic analyser circuitry, the logic analyser circuitry comprising:

a succession of two or more successive trigger condition detectors each configured to detect a match between a respective trigger condition and data handling activity relating to data handling transactions each having a respective transaction identifier;

the succession of trigger condition detectors being configured so that a detection by a trigger condition detector of a match with its respective trigger condition enables a next trigger condition detector in the succession to initiate detection of a match with the respective trigger condition of that next trigger condition detector; and a transaction identifier detector associated with a first trigger condition detector in the succession, configured to detect the transaction identifier relating to a data handling transaction for which a match is detected by the first trigger condition detector, and to supply the detected transaction identifier to a subsequent trigger condition detector in the succession of trigger condition detectors;

in which the subsequent trigger condition detector is configured to apply the detected transaction identifier as at least a part of its respective trigger condition so as to detect a match only in respect of a data handling transaction having that transaction identifier.

The example embodiments can be useful in the context of detecting trigger conditions relating to data handling transactions in systems (such as, for example, interconnect circuitry) which uses transaction identifiers to identify data handling transactions. A transaction identifier is captured at a first trigger condition detection stage, and then used in a subsequent (for example, a next) trigger condition stage as part of the respective trigger condition. For example, in an exemplary data handling transaction relating to a memory read access, a first trigger condition could relate to a data read address. When that trigger condition is met, a transaction identifier is captured and used as (at least part of) a subsequent (for example, a next) trigger condition. In this way, the subsequent trigger condition detector can use the transaction identifier to trigger the identification and tracking of all read data associated with the original read transaction address. Note that although an example is for a read data request and data as a response, there could be other transactions (snoops, snoop responses, read request acknowledgment, errors, and the like) that occur as a result of the original read request transaction identifier. Write transactions also have transaction identifiers that are used for the response back to the write data request. Accordingly, although an example of a read transaction is discussed, corresponding principles also apply to write data and other transactions. These are all examples of data handling transactions. For example, read data, transaction responses, and all other transactions (could be snoops, data from a snoop response, error, and the like) needed to complete transfer of the data could be matched with the captured transaction identifier using the subsequent trigger condition detector.

Accordingly, activity relating to a particular transaction can be identified, rather than just identifying activity relating to one trigger condition and then (possibly related, possibly unrelated) subsequent activity relating to another trigger condition.

In examples, the apparatus comprises a trace data generator configured to generate trace data indicative of a data handling transaction for which at least one of the trigger condition detectors detected a match. For example, the trace data generator can be configured to generate trace data indicative of a data handling transaction for which a last one in the succession of trigger condition detectors detected a match. In this way, trace data can be conveniently generated in respect of data handling transactions which are identified by the use of their transaction identifier.

In examples, at least one of the trigger conditions is dependent upon information present on an address bus and/or a data bus in respect of a data handling transaction. As discussed above, this technique can be used, for example, for an initial detection of a transaction meeting a trigger criterion. The transaction identifier can then be used as at least part of a trigger condition to detect subsequent activity relating to the same data handling transaction.

Although the captured transaction identifier could be passed to any subsequent trigger condition detector in the succession of trigger condition detectors, in example embodiments it is supplied for use by a next trigger condition detector in the succession.

Although the disclosure is relevant to any data handling activity in which data handling transactions are identified by respective transaction identifiers, in example arrangements, the data handling transactions are transactions between data handling nodes linked by interconnect circuitry. For example, one of the data handling nodes may comprise a memory; and the data handling transactions may be (or include) accesses to the memory.

In the example arrangement involving an interconnect, one way of assigning transaction identifiers is that a data handling node initiating a data handling transaction is configured to assign a node-specific transaction identifier to that transaction; and the interconnect circuitry is configured to apply a mapping between a node-specific transaction identifier and a respective interconnect transaction identifier which is unique amongst all pending transactions being handled via the interconnect circuitry. In such examples, a convenient way of operating the logic analysis process is for the transaction identifier detector to detect the interconnect transaction identifier.

Another example embodiment provides a data processing apparatus comprising:

apparatus as defined above;

a plurality of data handling nodes; and interconnect circuitry connected to the plurality of data handling nodes;

in which the apparatus comprising the logic analyser circuitry is configured to detect matches with trigger conditions in respect of data handling activity relating to data handling transactions between the data handling nodes via the interconnect circuitry.

Another example embodiment provides apparatus comprising logic analyser circuitry, the logic analyser circuitry comprising:

a succession of two or more successive trigger condition detection means for detecting a match between a respective trigger condition and data handling activity relating to data handling transactions each having a respective transaction identifier;

the succession of trigger condition detection means being operable so that a detection by a trigger condition detection means of a match with its respective trigger condition enables a next trigger condition detection means in the succession to initiate detection of a match with the respective trigger condition of that next trigger condition detection means; and a transaction identifier detection means associated with a first trigger condition detection means in the succession, configured to detect the transaction identifier relating to a data handling transaction for which a match is detected by the first trigger condition detection means, and to supply the detected transaction identifier to a subsequent trigger condition detection means in the succession of trigger condition detection means;

in which the subsequent trigger condition detection means is configured to apply the detected transaction identifier as at least a part of its respective trigger condition so as to detect a match only in respect of a data handling transaction having that transaction identifier.

Another example embodiment provides a method of logic analysis, the method comprising:

detecting a match between a trigger condition and data handling activity relating to data handling transactions each having a respective transaction identifier;

detecting the transaction identifier relating to a data handling transaction for which a match is detected;

supplying the detected transaction identifier to a subsequent trigger condition detection stage in a succession of trigger condition detections, the subsequent trigger condition detection stage applying the detected transaction identifier as at least a part of a respective trigger condition so as to detect a match only in respect of a data handling transaction having that transaction identifier; and in response to detection of a match, enabling a next stage in the succession of trigger condition detections, to detect a match with a next trigger condition.

In examples, the method can comprise generating trace data indicative of a data handling transaction for which at least one of the trigger condition detectors detected a match.

Another example embodiment provides a diagnostic apparatus comprising:

an input configured to receive a stream of trace data from apparatus as defined above; and a data processing element configured to process the trace data.

Another example embodiment provides a diagnostic method comprising:

receiving a stream of trace data generated by the method as defined above; and processing the trace data.

Another example embodiment provides a non-transitory machine-readable medium carrying computer software which, when executed by a computer, causes the computer to perform the diagnostic method as defined above.

Referring now to the drawings, FIG. 1 schematically illustrates a data processing apparatus comprising: a plurality of data handling nodes 10, 12, 14, 16, 18, 20 and interconnect circuitry 30 connected to the plurality of data handling nodes. The interconnect circuitry comprises a plurality of interfaces 40, 42, 44, 46, 48, 50 each associated with a respective one of the data handling nodes, and data routing circuitry 60 for controlling and monitoring data handling transactions as between the various data handling nodes.

The data handling nodes 10 . . . 20 can be various types of node, such as, for example, a processing element such as a CPU (central processing element) or CPU cluster, possibly with an associated cache memory; a memory; peripheral components such as input/output components, direct memory access (DMA) devices and so on. Some of the data handling nodes may be configured as master nodes, and some as slave nodes, with the master/slave distinction indicating which nodes have control of data handling transactions as between those nodes.

The data processing apparatus of FIG. 1 may be implemented as a single integrated circuit, for example as a so-called system on a chip (SoC). Alternatively, the data processing apparatus of FIG. 1 may be implemented as multiple discrete and interconnected systems.

In example embodiments, the interconnect circuitry may be an example of so-called cache coherent interconnect circuitry. Here, the term "coherent" refers to the maintenance of a correct relationship between multiple copies of the same data stored across the whole system. For example, data may be stored in a memory device as one of the data handling nodes (such as the node 10). Other nodes (such as the nodes 12, 14) may be processing elements having their own respective caches which, depending on the nature of the processing element operations, may store one or more copies of data which is also held in the memory 10. In the case of a data handling access by one node to such information, there is a need to ensure that the accessing node is accessing the latest version of the stored information, and that if it makes any alteration to the stored information, either other versions are correctly altered themselves or the other versions are deleted or invalidated. The data routing circuitry 60 includes various mechanisms to provide for coherent operation.

Figure 2:
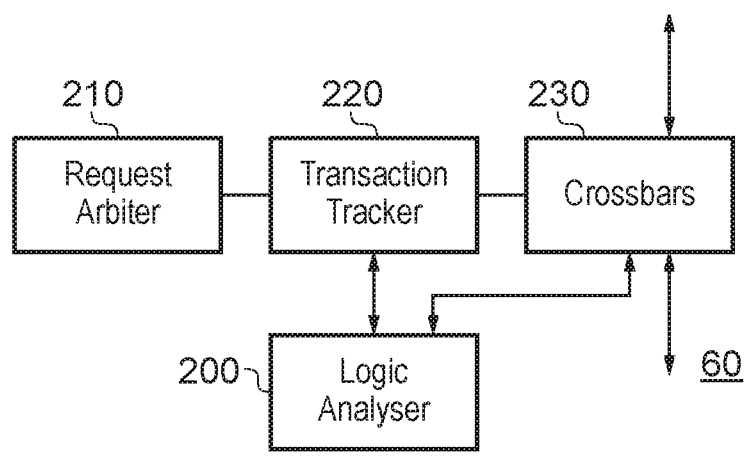
FIG. 2 schematically illustrates a part of the operation of the interconnect circuitry of FIG. 1.

FIG. 2 schematically illustrates a part of the operation of the data routing circuitry 60, which includes logic analyser circuitry 200.

The data routing circuitry comprises: a request arbiter 210 configured to arbitrate, prioritize and present for execution data handling requests made by one or more of the data handling nodes 10 . . . 20. Requests which are to be actioned are presented to a transaction tracker 220 which oversees the handling of each data handling transaction and manages queues of transactions. The transaction tracker distributes transactions to one or more so-called crossbars 230 which provide data paths between the data handling nodes.

The logic analyser circuitry 200 is configured to detect matches with trigger conditions in respect of data handling activity relating to data handling transactions between the data handling nodes via the interconnect circuitry. An example of a trigger condition is the presence, on an address bus or as part of an address to be accessed in a data handling transaction, a particular set of bits indicating a particular address or range of addresses. The logic analyser circuitry is a multi-stage arrangement having a succession of two or more successive trigger condition detectors each configured to detect a match between a respective trigger condition and data handling activity relating to data handling transactions. A detection of a trigger condition by one trigger condition detector in the succession then enables (for example, at a next clock cycle) the operation of a next trigger condition in the succession to await detection of its own trigger condition. In a simple example, a first trigger condition detector might detect, on an address bus or as part of a data address to be accessed, a particular address or range of addresses. The detection of this trigger condition then enables, for example at a next clock cycle, a next trigger condition detector in the succession to detect the presence of read data on a read bus (or as part of data read from, for example, a memory such as the memory 10). The activation of this second trigger condition detection stage causes trace data (to be discussed below) to be generated indicative of the read data.

Each data handling transaction in the system has an associated transaction identifier. In fact, in example embodiments, a data handling node initiating a data handling transaction (such as a CPU, CPU cluster, DMA device or other master) is configured to assign a node-specific transaction identifier to that transaction. But to provide for uniformity of handling within the interconnect circuitry, and to ensure that within the domain of the interconnect circuitry the data handling transactions can be distinguished from one another, the interconnect circuitry is configured to apply a mapping between a node-specific transaction identifier and a respective interconnect transaction identifier which is unique amongst all pending transactions being handled via the interconnect circuitry. This can apply to all transactions which are accepted for execution by the interconnect circuitry. A transaction is referred to by its interconnect transaction identifier during its handling by the interconnect circuitry, and then the interconnect circuitry can map that identifier back to the node-specific transaction identifier when returning a result of the transaction (for example, a read data value) to the originating node. An advantage of using transaction identifiers relates to the facts that (a) many transactions can be taking place at any time across the interconnect circuitry, and (b) an individual transaction can take some number of clock cycles to implement. So, in order to match the initiation of a transaction with the results of that transaction (which might appear somewhat later and may be interspersed with the results of other transactions) some sort of identification is used. This could be simply a memory address associated with the transaction, but memory addresses can be rather longer (for example, 128 bits) than is needed just to distinguish one transaction from another. So a shorter transaction identifier is used instead, for example in the range of 4-32 bits. A transaction identifier is unique, with respect to other pending transaction identifiers, while the transaction is in progress. When the transaction completes, the transaction identifier can be retired, but (depending on the system) it can be re-used later for another transaction.

So, in an example, one of the data handling nodes comprises a memory; and the data handling transactions are accesses to the memory, but it will be appreciated that other types of transaction are also envisaged.

Figure 3:
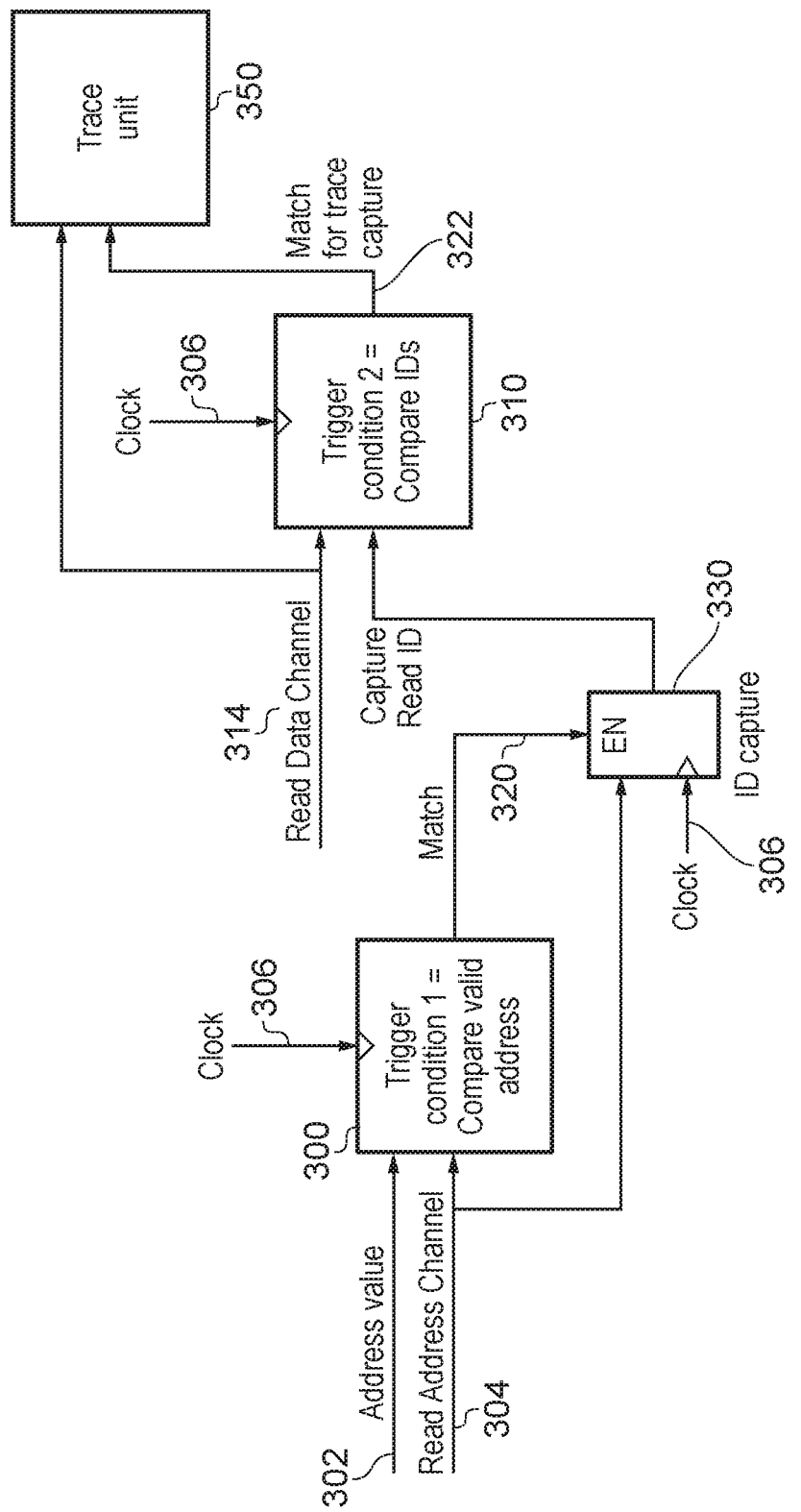
FIG. 3 schematically illustrates functions of a logic analyser.

FIG. 3 schematically illustrates functions of the logic analyser 200.

As mentioned above, the logic analyser uses a multiple stage trigger condition detection arrangement. In FIG. 3, only two stages are illustrated. More stages could be used. The stages could be arranged so as to loop back to an earlier stage in the succession. For the purposes of the present discussion, it is noted that a first stage in the succession, when triggered, enables trigger detection by a next or subsequent stage in the succession.

Accordingly, FIG. 3 illustrates apparatus comprising logic analyser circuitry, the logic analyser circuitry comprising a succession of two or more successive trigger condition detectors 310 each configured to detect a match between a respective trigger condition and data handling activity relating to data handling transactions each having a respective transaction identifier (such as the interconnect transaction identifier discussed above), the succession of trigger condition detectors being configured so that a detection by a trigger condition detector 300 of a match with its respective trigger condition enables a next trigger condition detector 310 in the succession to initiate detection of a match with the respective trigger condition of that next trigger condition detector. Note that the apparatus comprising the logic analyser circuitry could encompass just the logic analysis function or could encompass other functions as well.

A trigger condition relating to the trigger condition detector 300 relates to a particular value or range of values of an address value 302 relating to a current data handling operation. The trigger condition detector 300 also receives a read address channel 304 (being a channel providing the transaction identifier relating to a memory addressing operation). The trigger condition detector 300 is responsive to a clock signal to detect, at a clock edge, whether the current value of the address 302 matches that (or one of those) specified as the trigger condition. If not, then the trigger condition detector 300 simply waits for the next clock pulse to retry the detection.

If a match is obtained, then the trigger condition detector 300 sets a match signal 320 to indicate that a match has been obtained. This match signal enables a flip-flop or other device 330 configured to detect or capture the read address channel in response to the match signal 320. At the next clock pulse, the flip-flop 330 passes the captured value of the read address channel (containing the transaction identifier) as an input forming the trigger condition for the second trigger condition detector 310, to be compared by the second trigger condition detector 310 (at each clock cycle starting from the one after the triggering of the first trigger condition detector 300) with the transaction identifier currently provided by a read data channel 314 (being a channel providing a transaction identifier corresponding to a current data read operation, identifying a particular bus relating to the transaction). These two transaction identifiers, namely the value captured from the first trigger condition detection stage and the prevailing value on the read data channel 314, are compared by the second trigger condition detector 310 at each cycle of the clock 306 until a match is obtained, at which point the second trigger condition detector generates a match signal 322 to cause a trace unit 350 (which receives as inputs, not shown, data and/or address values relating to current data access operations) to capture trace data relating to the current data access.

The trace unit 350 may form part of the apparatus comprising the logic analyser circuitry and is an example of a trace data generator configured to generate trace data indicative of a data handling transaction for which at least one of the trigger condition detectors (such as a last one of the trigger condition detectors in the succession) detected a match. There are several known formats of trace data which are applicable to the present application, for example trace data formats which provide trace data items indicating an address of a data handling transaction and one or more read or write data values applicable to that transaction. The trace data can be supplied to a diagnostic apparatus (an example of which will be described below).

Therefore, the arrangement of FIG. 3 provides a detector 330 configured to detect or capture a transaction identifier detector for which a match is or was detected by the first trigger condition detector 300 in the succession 300, 310, and to supply the detected transaction identifier to a subsequent (for example, next) trigger condition detector 310 in the succession of trigger condition detectors. The subsequent trigger condition detector 310 is configured to apply the detected transaction identifier as at least a part of its respective trigger condition so as to detect a match only in respect of a data handling transaction having that transaction identifier.

As mentioned, at least one of the trigger conditions is dependent upon information present on an address and/or data bus in respect of a data handling transaction.

The example above referred to a data read transaction. It will be appreciated that corresponding techniques can apply to a data write transaction or to other types of transaction. For example, in the context of a read data transaction, there could be other transactions (snoops, data from snoop responses, read request acknowledgment, errors, and the like) that occur as a result of the original read request transaction identifier. In particular, read data, transaction responses, and all other transactions (could be snoops, data from a snoop response, error, and the like) needed to complete transfer of the data could be matched with the captured transaction identifier using the subsequent trigger condition detector. Write transactions also have transaction identifiers that are used for the response back to the write data request. The present description would also apply to write data and other transactions. These are all examples of data handling transactions. In general, transaction identifiers can be generated from reads, writes and other transaction requests, and the present techniques can apply to any such data handling transactions in which a transaction identifier is generated.

The example above related to a logic analyser as part of the interconnect circuitry. Such a logic analyser may be enabled or disabled under hardware or program control. Alternatively a logic analyser may be (or be part of) a separate device or apparatus connectable to the circuitry to be analysed. It will be appreciated that the present techniques are applicable to logic analysis of any circuitry in which transaction identifiers are used.

Instead of triggering the operation of the trace unit 350, a successful trigger by the succession of trigger condition detectors could, for example, cause the triggering of an external analysis device such as an oscilloscope, or the temporary stopping of system clocks, or the like.

Figure 4:
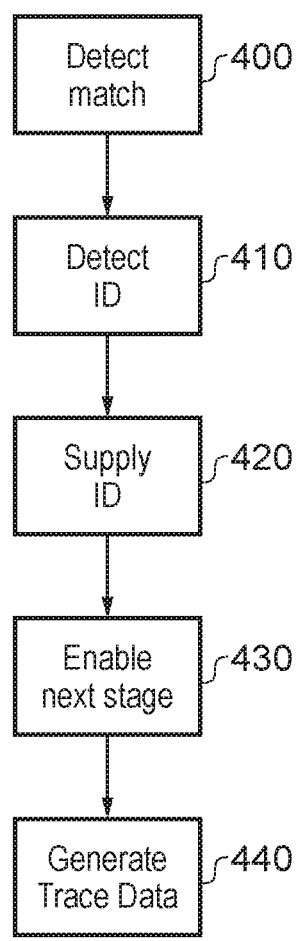
FIG. 4 is a schematic flow chart illustrating a logic analysis method.

FIG. 4 is a schematic flow chart illustrating a logic analysis method. The method comprises, at a step 400, detecting a match between a trigger condition and data handling activity relating to data handling transactions each having a respective transaction identifier.

A step 410 comprises detecting the transaction identifier relating to a data handling transaction for which a match was detected at the step 400.

At a step 420, the detected transaction identifier is supplied to a subsequent trigger condition detection stage in a succession of trigger condition detections, the subsequent trigger condition detection stage applying the detected transaction identifier as at least a part of a respective trigger condition so as to detect a match only in respect of a data handling transaction having that transaction identifier.

At a step 430, also in response to detection of a match at the step 400, a next stage in the succession of trigger condition detections is enabled, to detect a match with a next trigger condition. The steps 400, 420 and 430 can be repeated as necessary, according to the nature of the succession of trigger condition detectors. The step 410 does not need to be repeated in respect of a particular data handling transaction, because the transaction identifier has already been captured in respect of that transaction.

At a step 440, trace data is generated indicative of a data handling transaction for which at least one of the trigger condition detectors detected a match.

Figure 5:
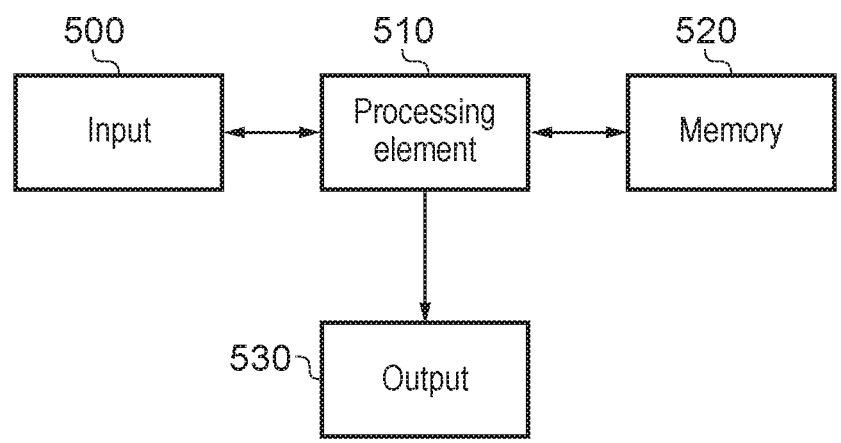
FIG. 5 schematically illustrates a diagnostic apparatus.

FIG. 5 schematically illustrates a diagnostic apparatus arranged to receive trace data from the apparatus of FIG. 3. The diagnostic apparatus comprises an input 500 configured to receive a stream of trace data from apparatus comprising logic analyser circuitry (for example, from the logic analyser 200) as discussed above, and a data processing element 510 configured to process the trace data. The data processing element may be a hardware data processing element (in that its diagnostic functions may be implemented as hardware operations rather than as data processing operations in response to software control), or may be a general purpose data processing element operating under the control of computer software such as software stored in a machine-readable non-transitory storage device such as a memory 520. In either case, the memory 520 may store related information for use in the diagnostic processing. An example of such related information is a portion of program or other code representative of operations being carried out by the apparatus (in this case, the interconnect circuitry and/or one or more of its associated data handling nodes of FIG. 1), in order to allow trace data to be compared to the expected operations of the apparatus.

An output 530 is provided to allow output of information generated as part of the diagnostic process.

Figure 6:
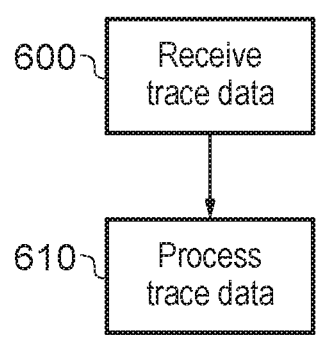
FIG. 6 is a schematic flowchart illustrating a diagnostic method.

FIG. 6 is a schematic flowchart illustrating a diagnostic method. The method comprises, at a step 600 (which follows the step 440 of FIG. 4 at which trace data was generated indicative of a data handling transaction for which at least one of the trigger condition detectors detected a match), receiving a stream of the trace data; and, at a step 610, processing the trace data, for example to detect aspects of the operation of the interconnect circuitry and/or connected data handling nodes. Note that the trace data is referred to as a stream of trace data. This may in some example embodiments refer to the manner by which the trace data is supplied to the diagnostic process. In other embodiments, it may refer to the nature of the trace data itself, even if the trace data is supplied as a block of data rather than a stream of data. In other words, the term "stream" of trace data can refer to the nature of the trace data as representing aspects of successive data handling transactions.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

The diagnostic techniques described above may be implemented in hardware, in software running on a general-purpose data processing apparatus such as a general-purpose computer, as programmable hardware such as an application specific integrated circuit (ASIC) or field programmable gate array (FPGA) or as combinations of these. In cases where the embodiments are implemented by software and/or firmware, it will be appreciated that such software and/or firmware, and non-transitory machine-readable data storage media by which such software and/or firmware are stored or otherwise provided, are considered as embodiments.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

I claim:

1. Apparatus comprising logic analyser circuitry, the logic analyser circuitry comprising:
   a succession of two or more successive trigger condition detectors;
   each of said succession of two or more successive trigger condition detectors being configured to detect a match between a respective trigger condition and data handling activity relating to data handling transactions, in which each of the data handling transactions is a transaction between data handling nodes linked by interconnect circuitry;
   each data handling transaction having a respective transaction identifier;
   the succession of trigger condition detectors being configured so that a detection by a trigger condition detector of a match with its respective trigger condition enables a next trigger condition detector in the succession to initiate detection of a match with the respective trigger condition of said next trigger condition detector; and
   a transaction identifier detector associated with a first trigger condition detector in the succession and configured to detect a transaction identifier relating to a data handling transaction for which a match is detected by the first trigger condition detector, the data handling transaction relating to the detected transaction identifier having a respective trigger condition, and to supply the detected transaction identifier to a subsequent trigger condition detector in the succession of trigger condition detectors;
   in which:
   the subsequent trigger condition detector is configured to apply the detected transaction identifier as at least a part of its respective trigger condition so as to detect a match only in respect of a data handling transaction having the transaction identifier;
   one of the data handling nodes comprises a memory;
   each of the data handling transactions is an access to the memory;
   a data handling node initiating a data handling transaction is configured to assign a node-specific transaction identifier to the transaction; and
   the interconnect circuitry is configured to apply a mapping between a node-specific transaction identifier and a respective interconnect transaction identifier which is unique among all pending transactions being handled via the interconnect circuitry.

2. Apparatus according to claim 1, comprising a trace data generator configured to generate trace data indicative of a data handling transaction for which at least one of the trigger condition detectors detected a match.

3. A diagnostic apparatus comprising:
   an input module configured to receive a stream of trace data from the apparatus according to claim 2; and
   a data processing element configured to process the trace data.

4. Apparatus according to claim 2, in which the trace data generator is configured to generate trace data indicative of a data handling transaction for which a last one in the succession of trigger condition detectors detected a match.

5. Apparatus according to claim 1, in which at least one of the trigger conditions is dependent upon information present on an address bus in respect of a data handling transaction.

6. Apparatus according to claim 1, in which at least one of the trigger conditions is dependent upon information present on a data bus in respect of a data handling transaction.

7. Apparatus according to claim 1, in which the subsequent trigger condition detector is a next trigger condition detector.

8. Apparatus according to claim 7, in which the transaction identifier detector is configured to detect the interconnect transaction identifier.

9. Data processing apparatus comprising:
   apparatus according to claim 1;
   in which the apparatus comprising logic analyser circuitry is configured to detect matches with trigger conditions in respect of data handling activity relating to data handling transactions between the data handling nodes via the interconnect circuitry.

10. Apparatus comprising logic analyser circuitry, the logic analyser circuitry comprising:
    a succession of two or more successive trigger condition detection means for detecting a match between a respective trigger condition and data handling activity relating to data handling transactions, in which each of the data handling transactions is a transaction between data handling means linked by interconnect means;
    each data handling transaction having a respective transaction identifier;
    the succession of trigger condition detection means being operable so that a detection, by a trigger condition detection means, of a match with its respective trigger condition enables a next trigger condition detection means in the succession to initiate detection of a match with the respective trigger condition of said next trigger condition detection means; and
    a transaction identifier detection means associated with a first trigger condition detection means in the succession, configured to detect a transaction identifier relating to a data handling transaction for which a match is detected by the first trigger condition detection means, the data handling transaction relating to the detected transaction identifier having a respective trigger condition, and to supply the detected transaction identifier to a subsequent trigger condition detection means in the succession of trigger condition detection means;
    in which:
    the subsequent trigger condition detection means is configured to apply the detected transaction identifier as at least a part of its respective trigger condition so as to detect a match only in respect of a data handling transaction having the transaction identifier;

one of the data handling means comprises a memory means;

each of the data handling transactions is an access to the memory means;

a data handling means initiating a data handling transaction is operable to assign a node-specific transaction identifier to the transaction; and the interconnect means is configured to apply a mapping between a node-specific transaction identifier and a respective interconnect transaction identifier which is unique among all pending transactions being handled via the interconnect means.

11. A method of logic analysis, the method comprising a data handling node initiating a data handling transaction, being a transaction between data handling nodes linked by interconnect circuitry, one of the data handling nodes comprising a memory;

the data handling node assigning a node-specific transaction identifier to the transaction;

the interconnect circuitry applying a mapping between a node-specific transaction identifier and a respective interconnect transaction identifier which is unique among all pending transactions being handled via the interconnect circuitry;

detecting a match between a trigger condition and data handling activity relating to data handling transactions;

detecting the interconnect transaction identifier relating to a data handling transaction for which the match is detected;

supplying the detected interconnect transaction identifier to a subsequent trigger condition detection stage in a succession of trigger condition detections, the subsequent trigger condition detection stage applying the detected interconnect transaction identifier as at least a part of a respective trigger condition so as to detect a match only in respect of a data handling transaction having the interconnect transaction identifier; and in response to detection of a match, enabling a next stage in the succession of trigger condition detections to detect a match with a next trigger condition.

12. A method according to claim 11, comprising:

generating trace data indicative of a data handling transaction for which at least one of the trigger condition detectors detected a match.

13. A diagnostic method comprising:

receiving a stream of trace data generated by the method of claim 12; and processing the trace data.

14. A non-transitory machine-readable medium carrying computer software which, when executed by a computer, causes the computer to perform the method of claim 13.

* * * * *